United States Patent [19]
Rollett et al.

[11] 3,886,469
[45] May 27, 1975

[54] FILTER NETWORKS

[75] Inventors: John Mortimer Rollett; David Richard Wise, both of London, England

[73] Assignee: The Post Office, London, England

[22] Filed: Jan. 10, 1974

[21] Appl. No.: 432,174

[30] Foreign Application Priority Data
Jan. 17, 1973 United Kingdom ................ 2483/73

[52] U.S. Cl. ................................ 330/107; 328/167
[51] Int. Cl. ................................ H03f 1/36
[58] Field of Search ......... 330/21, 31, 12, 107, 109; 333/80 R, 80 T; 307/295; 328/167

[56] References Cited

UNITED STATES PATENTS

| | | | |
|---|---|---|---|
| 3,501,709 | 3/1970 | Uetrecht | 330/21 |
| 3,564,441 | 2/1971 | Eide | 330/109 |

OTHER PUBLICATIONS

Bruton, "Network Transfer Functions Using the Concept of Frequency Dependent Negative Resistance," IEEE Transactions on Circuit Theory, August 1969, pp. 406–408.

Antoniou, "Bandpass Transformation and Realization using Frequency–Dependent Negative–Resistance Elements," IEEE. Transactions on Circuit Theory, March 1971, pp. 297, 298.

Kincaid, et al., "Get Something Extra in Filter Design," Electronic Design 13, June 21, 1969, pp. 114–121.

*Primary Examiner*—James B. Mullins
*Attorney, Agent, or Firm*—Kemon, Palmer & Estabrook

[57] ABSTRACT

Filter networks have generally been constructed from passive components in the form of resistor, capacitor and inductors. This invention uses active devices in a subnetwork to simulate inductors and combines the subnetworks to provide the desired filter characteristic such as a Butterworth, Tchebychev or pseudo-elliptic filters which are particularly useful in telephone circuitry for handling the audio tones uses in dialling.

4 Claims, 10 Drawing Figures

FILTER NETWORKS

The invention relates to active filter networks. The invention is applicable to low-pass and high-pass filters and to band-pass and band-stop filters, including those which can be formed by cascading appropriate low-pass and high-pass filters.

There are two basic problems facing filter network designers, firstly a circuit should be designed economically in terms of the number of components used and secondly the component values must be such as to produce the desired functional result. So as to utilise modern manufacturing methods, such as thin or thick film circuit techniques, the filter networks should preferably include no coils or inductors.

The present invention seeks to provide active filter networks which need only a small number of active devices, such as amplifiers, and a lay-out which enables the number of high stability components, such as resistors and capacitors, to be kept to a minimum compared with other known methods, at the same time providing networks with a performance which is relatively insensitive to small changes in element values.

The filter networks may be constructed using mainly resistive and capactive components and a small number of active devices, such as amplifiers. The amplifiers preferably have a high input impedance, low output impedance and a gain predetermined by the particular design of the filter network. The filter networks may provide Butterworth or Tchebychev or 'pseudo-elliptic' or 'pseudo Tchebychev' approximating functions.

According to the present invention there is provided an active filter network including a subnetwork having an impedance proportional to the reciprocal of the square of a complex frequency variable $s$ coupled effectively in series or in parallel with a capacitive impedance C arranged so that the whole active filter network is stable.

According to one aspect of the invention there is provided a low-pass filter network comprising a pair of input terminals a first one of which is coupled by way of a first resistor and a first capacitor in series to a first stage of the filter network, said first stage being coupled by way of a resistive impedance to one or more further stages, the final stage of which is coupled to an output amplifier by way of a second resistor in series and a second capacitor in parallel with the input to the final stage, and wherein each stage includes an amplifier, having a substantially unity gain and a high resistive input impedance, and a third resistor connected between the amplifier output and the junction between a third and fourth capacitor in series between the amplifier input and the second one of said input terminals.

According to a second aspect of the invention there is provided a low-pass filter comprising a number of stages coupled by way of a first resistor and a first capacitor, in series, to a first input terminal and by way of a second resistor in series and a second capacitor in parallel with the input to an output amplifier, each stage including an amplifier having a substantially infinite gain, the input to which is capacitively coupled by way of a third capacitor to the input to the stage and by way of a fourth capacitor to the output of said amplifier which is also directly coupled to the input of said amplifier by a third resistor.

According to a general aspect of the invention there is provided a low-pass or high-pass or a band-stop or a band-pass filter in which the filter includes a plurality of stages, each stage including an active device, such as an operational amplifier, which in the case of low-pass filters is arranged in a subnetwork forming the stage such that the input impedance $Z_{in}$ of the subnetwork is given by $$Z_{in} = [(1/sC_1) + (1/sc_2) + (1/s^2C_1C_2R_3)]/[1 + (1-k)(1/sC_2R_3)]$$

where:

$k$ is the amplifier gain and is substantially equal to unit; $C_1$ and $C_2$ are the capacitive impedances, in Farads, of two capacitive elements connected in series across the input to the amplifier and earth; $R_3$ is the resistive impedanace in ohms of a resistive element connected between the output of the amplifier and the junction between the two capacitive elements; and $s$ is the complex frequency variable.

In case of high-pass filters each of the capacitive elements of a low-pass filter is replaced by a resistive element having a resistive impedance equal to the reciprocal of the resistance it replaces (viz, $1/R_a$)

The active devices may consist of operational amplifiers having a high gain or a gain provided by means of a feedback network or the active devices may be formed by voltage follower circuits or in some circumstances emitter-follower or compound-emitter-follower circuits. The filter network may be constructed with integrated circuits or for large scale production thick-film or thin-film resistor networks may be practical with added amplifiers and external capacitors for cheapness.

The invention also concerns a method of arranging the layout of a filter network to produce the most desirable properties within the scope of the present invention.

The invention will now be described, by way of example, with reference to the accompanying diagrammatic drawings in which.

Figure 1:
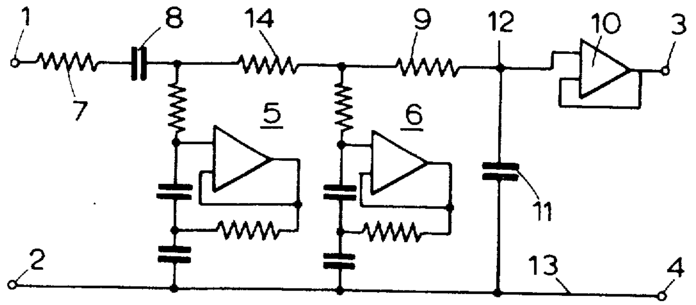
FIG. 1 shows an active filter network according to a first embodiment of the present invention.

So as to provide a comparison of the economy of components with the present invention, the network of FIG. 1 will be compared with known networks for providing similar functions. In a first known active filter network capable of meeting the low-pass filter specification requiring a fifth-order elliptic (or pseudo-elliptic) approximating function there are three amplifiers and 20 high stability elements. This compares with three amplifiers and 13 high stability elements of the network shown in FIG. 1. The sensitivity of the network shown in FIG. 1 is relatively low compared with the equivalent known network and for an alternative known active filter network to achieve the low-pass filter specification and low sensitivity to changes in element values comparable with the embodiment of the present invention as shown in FIG. 1 would require a network of seven amplifiers and 21 high stability elements.

It will therefore be appreciated that the present invention is economical in terms of components.

The active filter network of FIG. 1 will now be described in detail. The network is considered as lying between a pair of input terminals 1 and 2 and a pair of output terminal 3 and 4 and employs two stages 5 and 6. The first stage 5 is coupled to the terminal 1 by way of a resistor 7 and a capacitor 8 in series, and the second stage is coupled to the output terminal 3 by way of a resistor 9 and an amplifier 10 in series and a capacitor 11 in parallel between a junction point 12 at the positive input to the amplifier 10 and a line 13 directly connecting the terminals 2 and 4. The stage 5 is coupled to the stage 6 by a resistor 14.

Figure 2:
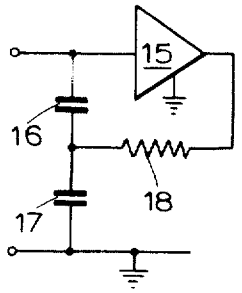
FIG. 2 shows a subnetwork for use in the active filter network shown in FIG. 1.
Figure 3:
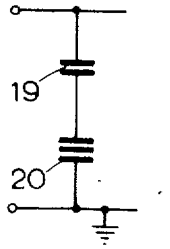
FIG. 3 shows an equivalent network of the subnetwork shown in FIG. 2.
Figure 4:
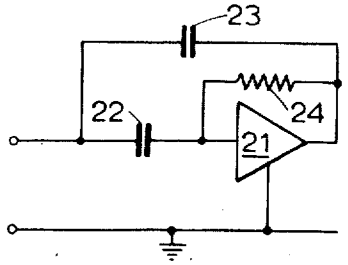
FIG. 4 shows a further subnetwork for alternative use in the filter network of FIG. 1, as exemplified in FIGS. 6, 7 and 9.

The stages 5 and 6 are substantially identical and will now be described with reference to FIG. 2. Referring now to FIG. 2, the subnetwork comprises an amplifier 15, having a gain of unity, to the input of which signals are applied across two capacitors 16 and 17. The output of the amplifier 15 is coupled to the junction point between the capacitor 16 and 17 by way of a resistor 18. FIG. 3 shows the equivalent network to the subnetwork of FIG. 2. The equivalent network consists of a capacitor 19 in series with an element 20 having an impedance proportional to $1/s^2$. A similar subnetwork is illustrated in FIG. 4. Referring now to FIG. 4 and to the equivalent network of FIG. 5, the subnetwork comprises an amplifier 21 to which an input signal is applied by way of a capacitor 22, the input side of which is connected to the amplifier output by way of a capacitor 23 and the output side of which is connected to the amplifier output by way of a resistor 24. The amplifier 21 has effectively an infinite gain. The equivalent network (of FIG. 5) consists of a capacitor 25 in parallel with an element 26 having an impedance proportional of $1/s^2$. In the network of FIGS. 2,3,4 and 5 the input signals are applied relative to earth, which in FIG. 1 is equivalent to the line 13. Referring again to the subnetwork shown in FIG. 2 and the equivalent networks of FIG. 3, the imput impedance $Z_{in}$ of this network is given by:

$$Z_{in} = [(1/sC_1) + (1/sC_2) + (1/s^2C_1C_2R_3)]/[1 + (1-k)(1/sC_2R_3)]$$

where: $C_1$ and $C_2$ are the values of capacitance of the capacitors 16 and 17; $R_3$ is the resistance of the resistor 18; and assuming that the input impedance of the amplifier is sufficient large to be negligible, and the voltage gain is $k$; $s$ is the complex frequency variable. If now the gain $k$ is exactly unity, the input impedance is $$Z_{in} = (1/sC_1) + (1/sC_2) + (1/s^2C_1C_2R_3)$$

which has the general form $Z_d$ and as shown in FIG. 3 the equivalent network input impedance is given by:

$$Z_d = (1/sC_4) + (1/s^2M_5)$$

where: $C_4$ is the capacitance of the capacitor 19; and $M_5$ is the value of $1/s^2$ element 20.

One embodiment of the present invention employs a design method which requires impedances having this general form. It is a particular property of this network, which makes it especially useful in the construction of networks with low sensitivity, that is the amplifier is not 'ideal' the changes in $Z_d$ caused by departures from the ideal are largely negligible. Thus if the input capacitance is not negligible, it can be absorbed into the term $C_4$, while if the output resistance is not negligible, it can be absorbed into the resistance $R_3$ which should be as small as convenient. Furthermore, if the gain $k$ departs slightly from unity, the first-order effects are simply to change the values of $C_4$ and $M_5$ slightly, and to introduce into the impedance $Z_d$ a small term in $1/s^3$, which is negligible.

Figure 5:
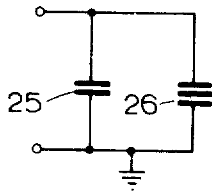
FIG. 5 shows the equivalent network of the subnetwork shown in FIG. 4.

In the other subnetwork, shown in FIG. 4 and the equivalent network of FIG. 5, the input admittance $Y_{in}$ of this network is given by:

$$Y_{in} = [s/(C_6 + C_7) + s^2C_6C_7R_8]/[1 + sC_6R_8/(1 + A)]$$

where: $C_6$ and $C_7$ are the capacitance of capacitors 22 and 23; and $R_8$ is the resistance of the resistor 24; and where it has been assumed that the input admittance and output impedance are negligible, and the voltage gain is $-A$. If now the voltage gain is very large, i.e., negligibly different from infinity, the input admittance is $$Y_{in} = s(C_6 + c_7) + s^2C_6C_7R_8$$

which has the general form, as related to FIG. 5, given by $$Y_e = sC_9 + s^2M_{10}$$

where: $C_9$ is the capacitance of the capacitor 25; and $M_{10}$ is the value of the element 26. One embodiment of the present invention employs a design method which requires admittances having this general form.

The subnetwork of FIGS. 4 and 5 like the previous subnetwork of FIGS. 2 and 3 also has the property that the departure of the amplifier from the ideal has a largely negligible effect on the admittance $Y_e$. Thus the first order effect of the gain A being finite (but still large) is to alter slightly the values of $C_9$ and $M_{10}$, and to add a small admittance proportional to $s$ which can be neglected. This network is therefore especially suited to the construction of networks with low sensitivity. The resistance $R_8$ of the resistor 24 should be as large a convenient. It will be seen that a feature common to both the impedances provided by subnetworks of FIGS. 2 to 5 is the impedance proportional to $1/s^2$. In the first subnetwork the $1/s^2$ element ($M_5$) is in series with a capacitive element $C_4$ (proportional to $1/s$) and in the second subnetwork the element ($M_{10}$) is in parallel with the capacitive element ($C_9$). The $1/s$ element (M) is a frequency dependent negative resistance element.

It is known from standard network theory that such a $1/s^2$ element is unstable, and it is a special property of the whole network that the subnetworks are stabilised and are prevented from rendering the whole network unstable.

It has been found experimentally that the sensitivity of the filter network of FIG. 1 is very approximately of the order of one tenth of that of currently available equivalent networks. This feature allows the tolerances to be relaxed, and it is possible that in larger scale production a thick film resistor network with added active devices, such as solid state amplifiers and polystyrene capacitors could form a suitaable cheap filter.

The low-pass filter networks of the present invention may be considered analogous to lossy LC ladder filters and all such filters have previously been thought to be very sensitive. The filter networks of the present invention have been tested to disprove the generallity of the foregoing statement and it has been established that some lossy LC ladder filters are relatively insensitive and that the insensitivity is retained in the RC analogue network.

Figure 6:
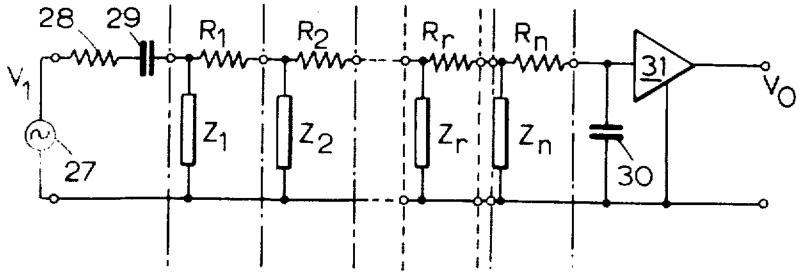
FIG. 6 shows a general low-pass filter according to the present invention.

As mentioned earlier one of the problems facing a filter designer is the arrangement of the layout of the elements of a network without regard to the specific value of the element. This is hereinafter referred to as the topology of the network. One special topology according to the present invention is shown in FIG. 6. This topology is suitable for a low-pass filter driven by a voltage generator of negligible output impedance.

Referring now to FIG. 6 the network includes $n$ stages represented by the impedances $Z_1$ to $Z_n$. Each of the stages is linked by a resistor $R_1$ to $R_n$. The input to the network from a generator 27 is by way of a resistor 28, having a resistance $R_0$ and a capacitor 29, having a capacitance $C_0$, in series. A capacitor 30 across the filter network output couples into an amplifier 31.

For some purpose it may be desirable to omit either resistor 28 or resistor $R_n$. The number of intermediate stages each consisting of a series resistor $R_r$ and a shunt impedance *Z0hd r* is determined by the required characteristics of the filter.

The impedances indicated by $Z_1$ to $Z_n$ can in general be provided by either of the subnetworks shown in FIGS. 2 and 4, or the other subnetworks with or without additional resistance in series or parallel, provided that an appropriate design is used in each case. The impedances are required to include an element proportional to $1/s^2$, and in principle other subnetworks could be used if they employ only one amplifier and have low sensitivity. The special topology of FIG. 6 (with the possible omission of resistor 28 and $R_n$) is capable of providing low-pass filter networks with a very low sensitivity, if designed according to the principles to be described below.

It is possible for some purposes to omit either capacitor 29 or capacitor 30. However, such an omission has the effect of increasing the sensitivity to a significant extent, and is perhaps not often likely to be attractive in practice. Alternative arrangements which involve a slight alteration from that of FIG. 6 will now be considered. If the voltage source 27 has finite internal resistance, then this may be absorbed into the value of $R_0$ of the resistor 28 (provided $R_0$ is larger than the internal resistance). For driving the filter from a current source, then the 'Norton equivalent' of a current source in parallel with a resistance of $R_0$ may be substituted.

Figure 7:
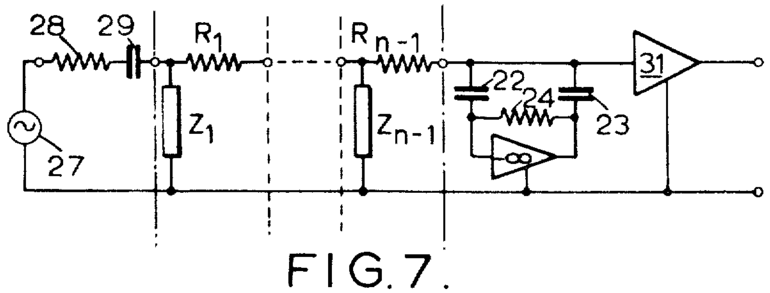
FIG. 7 shows a modified version of the general low-pass filter of FIG. 6.

If $R_n$ can be omitted, then it may be desirable to use the subnetwork shown in FIG. 4 for impedance $Z_n$, and at the same time to omit the capacitor 30, since this element can be absorbed into the shunt capacitance of the capacitor 25 in the subnetwork of FIG. 5. This arrangement is shown in FIG. 7. Where possible the elements of FIG. 7 have been given the same reference numerals and letters as similar elements elements of FIG. 6. The $N^{th}$ stage now consists of a subnetwork as shown in FIG. 4 and is given the same reference numerals as FIG. 4. If the impedance level at the input of the output buffer amplifier 31 is low, and the load has a high impedance, than the output buffer amplifier may be omitted with only a slight degradation in the performace of the filter.

There are circumstances where a resistance in series or in parallel with the capacitor 30 may be used, but such a resistance has the effect of significantly increasing the sensitivity, and is unlikely to be used if it can be avoided. The larger the shunt resistance, or the smaller the series resistance, the smaller is the adverse effect. With some types of amplifier, a d.c. path to ground at the input is required to prevent saturation and in these circumstances a very high value resistance, say 1 to 10 M ohms, or one or more diodes in series may be placed in shunt across the input of the amplifier. Such elements have a negligible effect on the filter characteristic, in general.

One method of designing a network with the general topology of FIG. 6 will now be described. A typical example of the resulting kind of filter network was given in FIG. 1. The special criterion which results in networks of the lowest possible (or lowest desired) sensitivity to small variations in element values is then introduced.

The following matrix is useful in the design of the network of FIG. 6.

$$\begin{bmatrix} R_0 + (1/sC_0) & 1 & & & & & & & \\ -1 & Y_1 & 1 & & & & & & \\ & -1 & R_1 & 1 & & & & & \\ & & -1 & Y_2 & 1 & & & 0 & \\ & & & -1 & \cdot & \cdot & & & \\ & & & & \cdot & \cdot & 1 & & \\ & & & & & -1 & Y_n & 1 & \\ & 0 & & & & & -1 & R_n & 1 \\ & & & & & & & -1 & sC_{n+1} \end{bmatrix} \qquad (1)$$

Here $Y_1$ is the admittance of impedance $Z_1$, i.e., $Y_1 = (1/Z_1)$, etc; the elements off the three diagonals are all zero. If the determinant of this matrix is denoted by $D(s)$, then the transfer function of the filter is given by:

$$v_0/v_1 = 1/D(s) \quad (2)$$

where: $v_0$ is the output voltage signal; and $v_1$ is the input voltage signal. It is necessary now to determine the transfer function as the ratio of two polynomials in the variable $s$, where the coefficients are algebraic functions of the elements of the network. At this stage therefore a decision must be made as to which subnetworks will be employed for each impedance $Z_1$, etc., in FIG. 6. This decision can later be altered if the resulting network is unsatisfactory for some reason (e.g., difficulty or impossibility of meeting required specification, unsuitable range of element value, etc). In general, as with all filter design several trials may be necessary, at any stage in the design process, in order to achieve a commercially useful network.

FIG. 1 will now be used to explain the further stages of the design. In this case, the transfer function has the 'pseudo-elliptic' form:

$$v_0\,(1 + as + bs^2)\,(1 + cs + ds^2)]/[1 + es + fs + gs + hs + js] \quad (3)$$

where each of $a,b \ldots j$ is an algebraic function of the elements. It is now necessary to consider the specifiction the filter is required to meet. By well-known methods, probably with a computer, a numerical approximating function with the same expression as in equation (3) is found, if at all possible, which lies within the specification limits; if not possible, a more elaborate network may be required, and the design cycle must be started again. The approximating function thus gives numerical values to the coefficients $a, b \ldots j$. It is now required to determine the element values of the network, and one way to do this is to solve the nine simultaneous equations produced by equating the algebraic functions of the elements to the nine numerical values of $a,b \ldots j$.

Examinations of FIG. 1 shows that there are 13 elements. Reference to FIG. 2 shows that three physical elements are required to produce two effective equivalent elements in subnetwork FIG. 3, so that the effective number of element values to be found is 11. One of the element values can be chosen arbitrarily. Thus there are nine equations to determine 10 element values, indicating that there is one degree of freedom. In principle, therefore, another element value can be chosen arbitrarily, and the values of the remaining elements will be determined by the equations. (It should be mentioned that there may be limits on the choice of a second element value, in order that the equations remain solvable for positive element values.)

The method described above, partly with reference to a particular examaple, will lead to one possible set of element values for a filter network with the approximating function which meets the given specification. The special criterion which leads to the network with low sensitivity will now be introduced.

The special criterion is this. The degree (or degrees) of freedom mentioned above should be used to design the network for which the ratio $$k = C_0/C_{n+1} \quad (4)$$

is as close to unity as possible; $k$ will be greater than or less than unity. If we denote the limiting value of $k$ by $k_0$, then the sensitivity of the network with ratio $k_0$ will be lower than that of other networks (having the same transfer function) which have $k$ further removed from 1 than $k_0$. If (for such a network) $k$ is not markedly different from $k_0$, then the sensitivity may well be low enough to be acceptable, in a given application. But in general there will be little reason not to use the network with $k = k_0$. In general it is found that the value of $k_0$ can be made closer to unity by arranging for $C_4$ to be as large as possible compared with $\omega^2 M_5$ (for near the passband edge) in subnetwork of FIG. 3; and by arranging for $C_9$ to be as small as possible compared with $\omega^2 M_{10}$ in subnetworks of FIG. 5. On the other hand, if these ratios are made too extreme, some of the element values become inconveniently large or small. It is therefore necessary to reach a compromise.

It will now be appreciated why the omission of $C_0$ or $C_{n+1}$ is undesirable. It has the effect of making the parameter $k_0$ zero or infinite, that is as far removed from unity as possible. The sensitivity of such a network is much greater than the networks with $k_0$ near to unity. It should be added that 'near to unity' does not imply 'nearly equal to unity.' Values of $k_0$ are often found in practice to lie between 2 and 10. The methods of building improved filter networks, given here, have been described in terms of low-pass filters. High-pass filters may be built by using the methods described to design a low-pass filter, and then replacing each resistor $R_a$ by a capacitor of value $1/R_a$, and replacing each capacitor $C_b$ by a resistor of value $1/C_b$. Such networks will retain all the desirable characteristics of the low-pass network.

Band-pass and band-stop filters can be constructed by cascading appropriate low-pass and high-pass filters. They may also be designed directly by an extension of the methods used for designing low-pass filters.

The high gain amplifiers may be provided by 'operational amplifiers.' The unity-gain amplifiers may be provided by operational amplifiers with feedback, by voltage follower circuits, or in favourable cases by emitter follower or compound emitter follower transistor circuits.

Three specific examples of filters constructed according to the invention will now be described. These filters have particular application in the telephone system for filtering the audio tone used to transmit the dialling digits. The filter network of FIG. 8 includes a subnetwork similar to that shown in FIG. 2 and if given the same reference numerals as similar elements of FIG. 2. The input terminals 32 and 33 are coupled to the subnetwork by way of a resistor 34 and a capacitor 35 in series and by way of an earthed line 36 respectively. A resistor 37 is connected in series with the capacitors 16 and 17. An output resistor 38 and an output capacitor 39 couples the filter to an output amplifier 40.

Figure 8:
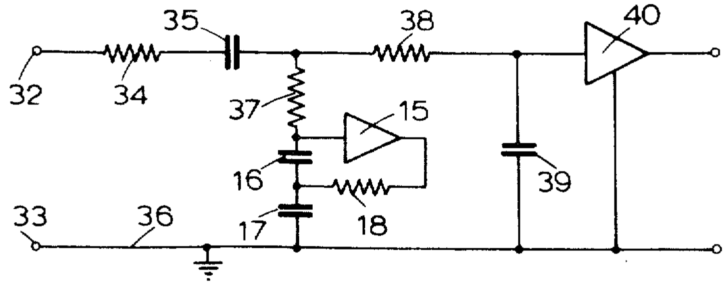
FIG. 8 shows a third-order low-pass filter.

In operation, the network of FIG. 8 acts as a third order low-pass 'pseudo-elliptic' filter, which with the element values of TABLE 1 (below) has a pass-band ripple of 1 dB, cut-off frequency of 3.40 kHz, and stop-band discrimination of 30 dB. With the element values of TABLE 2 (below) it has a pass-band ripple of 0.1 dB, cut-off frequency of 3.40 kHz, and stop-band discrimination of 30 dB.

TABLE 1

| | |
|---|---|
| Resistor 34 = 85.28 Kohms | Capacitor 35 = 1847 pF |
| Resistor 38 = 144.9 Kohms | Capacitor 16 = 12,200 pF |
| Resistor 36 = 20.00 Kohms | Capacitor 17 =12,220 pF |
| Resistor 18 = 191.5 ohms | Capacitor 39 = 468.1 pF |

TABLE 2

| | |
|---|---|
| Resistor 34 = 63.62 Kohms | Capacitor 35 = 1246 pF |
| Resistor 38 = 73.89 Kohms | Capacitor 16 = 11.95 nF |
| Resistor 36 = 10.52 Kohms | Capacitor 17 = 11.95 nF |
| Resistor 18 = 195.8 ohms | Capacitor 39 = 468.1 pF |

Figure 9:
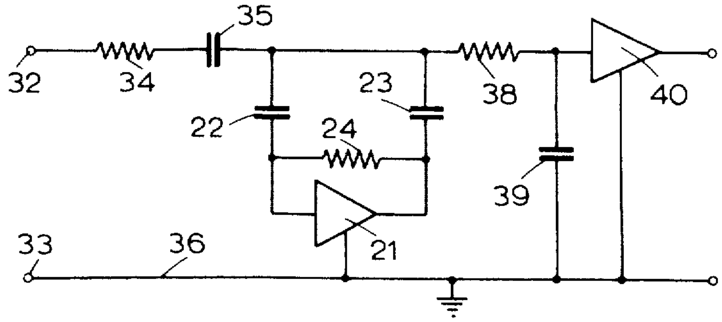
FIG. 9 shows a further third-order low-pass filter.

The filter network of FIG. 9 includes a subnetwork similar of that shown in FIG. 4 and is given the same reference numerals. The subnetwork is connected between an earthed line 36 and by way of the input impedances formed by resistor 34 and capacitor 35 in series to an input terminal 33. The output coupling network is formed by the resistor 38 and capacitor 39 feeding the amplifier 40.

The Network of FIG. 9 acts as a third-order low-pass Tchebychev filter, which with the element values of TABLE 3 has a pass-band ripple of 1 dB and cut-off frequency of 3.4 kHz.

TABLE 3

| | |
|---|---|
| Resistor 34 = 1.303 Kohms | Capacitor 35 = 133.86 nF |
| Resistor 24 = 144.3 Kohms | capacitor 22 = 4.00 nF |
| Resistor 38 = 4.197 Kohms | Capacitor 23 = 4.00 nF |
| | Capacitor 39 = 20.0 nF |

Figure 10:
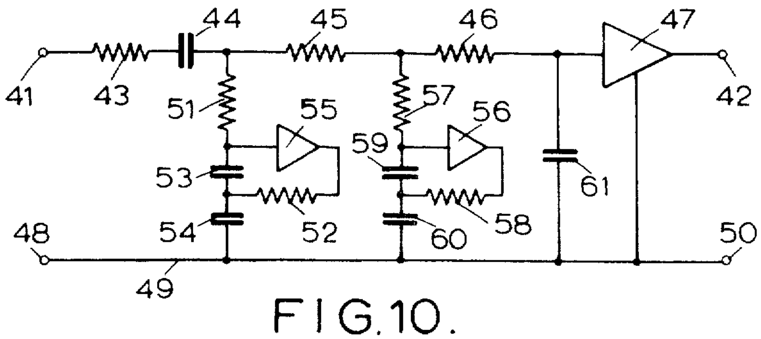
FIG. 10 shows a fifth-order low-pass filter.

The filter network of FIG. 10 includes two subnetworks similar to that shown in FIG. 2. An input terminal 41 is coupled to an output terminal 42 by way of a resistor 43, a capacitor 44, a resistor 45, a resistor 46 and an amplifier 47 in series. The other input terminal 48 is coupled by way of a line 49 to the other output terminal 50. The first subnetwork is connected between the junction between the capacitor 44 and resistor 45 and the line 49. The first stage subnetwork comprises two resistors 51 and 52, two capacitors 53 and 54, and an amplifier 55 having a substantially unity gain. The second stage subnetwork also includes an amplifier 56 having a gain of unity and two resistors 57 and 58 and two capacitors 59 and 60. A capacitor 61 is connected between the input of the amplifier 47 and the line 49.

The network of FIG. 10 acts as a fifth-order low-pass 'pseudo-elliptic' filter, which with the element values of TABLE 4 has a band-pass ripple of 0.1 dB and cut-off frequency 3.4 kHz.

TABLE 4

| | |
|---|---|
| Resistor 43 = 300.4 Kohms | Capacitor 44 = 176.6 pF |
| Resistor 51 = 38.76 Kohms | Capacitor 53 = 14.47 nF |
| Resistor 52 = 80.90 ohms | Capacitor 54 = 14.47 nF |
| Resistor 45 = 122.3 Kohms | Capacitor 59 = 23.94 nF |
| Resistor 58 = 48.88 ohms | Capacitor 61 = 936.2 pF |
| Resistor 46 = 26.86 Kohms | |

What we claim is:

1. An insensitive low-pass filter network comprising an input port including a first and a second input terminal, said first input terminal being connected by way of a first resistor and a first capacitor in series to a first stage of the filter network, said second input terminal being earthed, said first stage being coupled by way of a resistive impedance to one of a plurality of further stages, having a final stage which is coupled by way of a second resistor in series with an input to an output amplifier, and which final stage is coupled to a second capacitor between said input to the output amplifier and the second input terminal, and wherein each stage of the filter network includes a single stage amplifier, having substantially unity gain, and a third resistor connected between an output of the stage amplifier and a junction between a third and a fourth capacitor coupled in series between an input of the stage amplifier and the second input terminal.

2. An insensitive low-pass filter network as claimed in claim 1 in which each stage amplifier consists of an operational amplifier having a high resistive input impedance and having a feed-back path providing a voltage feed-back to maintain the amplifier gain at substantially unity.

3. An insensitive low-pass filter network as claimed in claim 1 in which the output amplifier consists of a differential input operational amplifier having an inverting input terminal which is directly connected to an output of the amplifier, and having a non-inverting input terminal which forms said input to the output amplifier.

4. An insensitive low-pass filter network comprising a number of stages the first stage of which is coupled by way of a first resistor and a first capacitor in series to a first input terminal of an input port formed by said first input terminal and a second input terminal which is earthed and the last of said stages being coupled to an input of an output amplifier by way of a second resistor in series, and a second capacitor in parallel between said output amplifier input and said second input terminal, each of said stages including a single stage amplifier having substantially infinite gain, and having an input which is capacitively coupled by way of a third capacitor to the input of the stage which said input of the stage is directly coupled by way of a fourth capacitor to the output of said stage amplifier which output of the stage amplifier is also directly coupled to the input of said stage amplifier by way of a third resistor.

* * * * *